COMBINATION AUTOMATIC-GAIN-CONTROL AND SILENCER AMPLIFIER
Filed Feb. 1, 1954
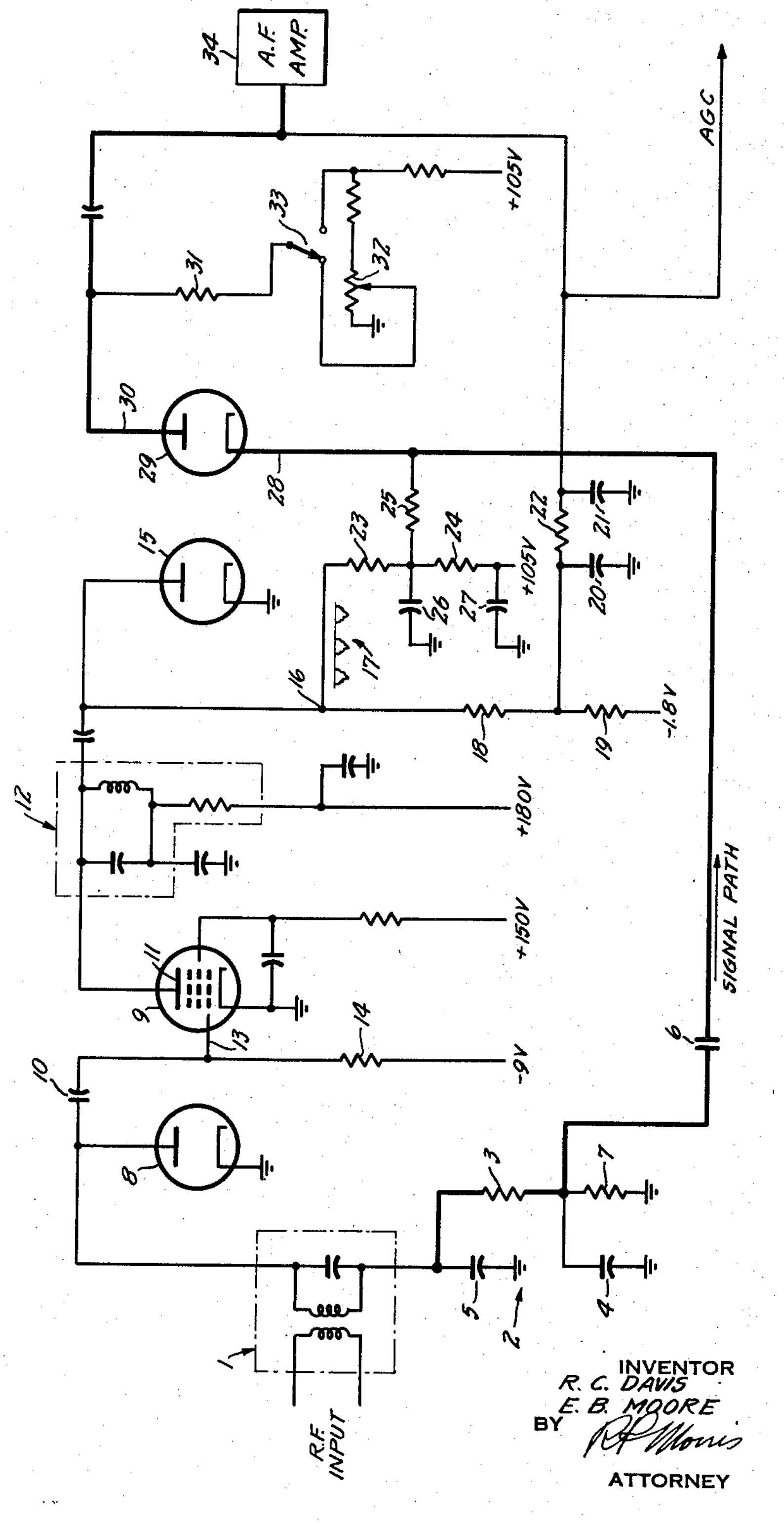
INVENTOR
R. C. DAVIS
E. B. MOORE
BY [signature]
ATTORNEY 2,802,099

COMBINATION AUTOMATIC-GAIN-CONTROL AND SILENCER AMPLIFIER

Richard C. Davis, Nutley, and Edward Bates Moore, Cedar Grove, N. J., assignors to International Telephone and Telegraph Corporation, New York, N. Y., a corporation of Maryland Application February 1, 1954, Serial No. 407,404

12 Claims. (Cl. 250—20)

This invention relates to automatic-gain-control and silencer circuits and particularly to an amplifier, common to both said circuits, for producing biasing voltages which are applied to the stages being controlled.

Automatic-gain-control (AGC) systems are employed in radio receivers to maintain the carrier voltage at the detector approximately constant. This is accomplished by biasing the appropriate stages of the receiver negatively with a direct-current voltage derived by rectifying the carrier. An increase in the signal hence increases the negative bias and tends to counteract the increased signal by reducing the amplification, and vice versa.

Silencer or squelch circuits are also employed in radio receivers, although less frequently than automatic-gain-control circuits, to block the audio stages during the absence of the carrier, thereby preventing inherent receiver noises from reaching the output of the receiver; particularly when the receiver is of the high-gain type.

It is also known to employ amplified AGC voltage to control the appropriate stages. However, according to the conventional circuits, separate amplifiers are provided for amplifying the AGC voltage and silencer control voltage respectively.

An ideal AGC system would not affect the receiver amplification until the incoming signal reached a level sufficient to produce an adequate voltage at the input of the second detector, and then with larger signals would maintain this output constant. Conventional circuits employ additional time-constant circuits, very often including several tubes, for performing this function.

It is an object of this invention to provide a combination automatic-gain-control circuit and silencer circuit operating from a common amplifier.

In accordance with a first feature of this invention the combination system requires fewer tubes and components than similar systems heretofore known.

In accordance with another feature of this invention the common amplifier is operable in response to the intermediate-frequency signal and is therefore not subject to the variation of the conventional direct-current AGC amplifier.

In accordance with still another feature of this invention, the common amplifier is also utilized to provide the desirable delay action.

It is a further object of this invention to provide a combination AGC and silencer system for producing appropriate biasing voltages whose variation is a function of resistive networks rather than tube transconductance.

In accordance with a broad aspect of the invention, there is provided a combination AGC circuit and silencer circuit for developing suitable biasing voltages in response to the amplitude of an input wave. The input wave is amplified and from the amplifier, means are provided for deriving a gain-control biasing voltage and silencing biasing voltage.

The above-mentioned and other features and objects of this invention and the manner of attaining them will become more apparent by reference to the following description of an embodiment of the invention taken in conjunction with the accompanying drawing, wherein the single figure is a schematic diagram of the combination automatic-gain-control and silencer circuits.

A modulated carrier wave is applied to the system over a transformer tuned to the carrier-frequency shown generally at 1. The carrier is preferably an intermediate-frequency wave. A modulation frequency, or audio frequency, filtering circuit generally indicated at 2, is coupled to one terminal of the input circuit 1. The filtering circuit 2 comprises a resistor 3 and a capacitor 4 which function as a resistance-capacitance low-pass filter and prevents the intermediate-frequency ripple voltage developed across condenser 5 from reaching the output of this circuit. Condenser 6 is provided to prevent the direct-current component of the rectified output from reaching the output of this circuit and must be chosen large enough to be an effective pass for audio frequencies developed across resistor 7.

An audio-frequency detector 8, preferably a diode, is coupled to the other terminal of the input circuit 1. The detector rectifies the positive half of the modulated carrier wave and this rectified voltage is applied to the audio-frequency filtering circuit 2. The input modulated carrier component of the rectified wave is also applied to an amplifier 9 over a capacitor 10. The amplifier 9 is preferably a sharp cut-off pentode, and is loaded in its plate circuit 11 by a resonant circuit generally indicated at 12. The resonant circuit 12 is tuned to the intermediate-frequency and preferably has a relatively low Q factor so that its bandwidth is wide as compared with the intermediate-frequency bandwidth.

Suitable delay action is obtained by biasing the grid 13 of the amplifier 9 with a negative voltage, for example, —9 volts over a resistor 14. Since the amplifier is preferably of the sharp cut-off type, having a plate current cut-off point at about —5 volts grid bias, for example, conductance of the amplifier 9 does not take place until the level of the input carrier wave exceeds 3 or 4 volts. In an actual embodiment a pentode type 6AK5 was used and it was found advisable to apply 150 volts over a decoupling resistance to the screen grid and 180 volts over a decoupling resistance to the anode of this pentode.

A diode 15 is coupled to the output of the resonant circuit 12. Diode 15 passes the positive half of the signal from the amplifier 9 to ground and rectifies the negative half of the modulated carrier wave so that at point 16, a wave envelope such as shown at 17, will appear.

A gain control bias circuit comprising a voltage divider consisting of resistors 18 and 19, is connected between point 16 and a source of negative reference potential, shown by way of example as —1.8 volts. The voltage applied to the voltage divider network is reduced to about one-eighth its full value by operation of the resistors 18 and 19. This reduced negative voltage formed at the junction of resistors 18 and 19 is filtered by a resistance-capacitance filter comprising capacitors 20, 21 and resistor 22, to remove the alternating-frequency components. Thus, the gain control voltage is a direct-current voltage proportional to the rectified carrier. Since the automatic-gain-control voltage is a small fraction of the voltage developed, variations in this voltage due to the changes in the transconductance of the amplifier do not vary the control voltage appreciably. This is a major advantage of the present invention.

Resistor 19 is returned to a negative voltage instead of ground, so that the automatic-gain-control bus-bar voltage cannot go more positive than this potential. This, therefore, serves as a minimum bias on the stages being controlled by the AGC voltage.

A silencer biasing circuit comprising a voltage divider network consisting of resistors 23 and 24 is connected between point 16 and ground. A resistance-capacitance filter comprising capacitors 26, 27 and resistor 24 is also provided in this biasing circuit to remove the alternating frequency components. Thus, the silencing control voltage is also a negative direct-current voltage proportional to the rectified carrier. The portion of the voltage at point 16 represented by the drop in resistors 23 and 24 is combined with the positive voltage from the supply source and fed to cathode 28 of gating diode 29 through common resistor 25. The resultant voltage constitutes the biasing voltage applied to the cathode 28. The values of resistors 23 and 24 are selected such that the resultant voltage variation with the signal input is approximately six times the variation of the automatic-gain-control bus-bar voltage. The anode 30 of the diode 29 is returned over resistance 31 to a potentiometer 32. The potentiometer 32 is provided to set the signal input level at which the diode is rendered conducting. When the anode voltage is made more positive by moving the adjustable tap of the potentiometer toward the positive end, only a low signal input level is required to make the cathode negative with respect to the plate and thereby causes the diode to conduct.

A switch 33 is provided for disabling the silencer action. This is accomplished by returning the anode 30 to a more positive voltage thereby insuring its conduction for all signal input conditions. The output from the diode 29 is coupled to an audio frequency amplifier shown diagrammatically at 34.

During the absence of a signal, the cathode 28 of the diode 29 is more positive than the anode, thereby rendering the diode non-conducting. Upon receipt of an input signal, a negative voltage is developed at the anode of diode 15, which subtracts from the positive voltage to make the resultant voltage on cathode 28 less positive, thereby causing diode 29 to conduct. Thus, in effect, the diode 29 operates as a gating tube to permit the passing therethrough of the audio frequencies, during the conduction thereof, to the audio stages. It is seen that the audio frequencies passed by the filter circuit 2, are applied to the cathode 28 of the silencer diode 29.

While we have described above the principles of our invention in connection with specific circuitry, it is to be clearly understood that this description is made only by was of example, particularly the references made during the description of the invention to the biasing voltages, and not as a limitation to the scope of our invention as set forth in the objects thereof and in the accompanying claims.

What is claimed is:

1. A combination automatic-gain-control circuit and silencer circuit for developing suitable biasing voltages in response to the level of an input carrier wave, comprising a signal wave input circuit, a carrier wave amplifier coupled to said input circuit, a detector coupled to said input circuit, an audio frequency amplifier, voltage controlled gating means for applying detected signals derived from said detector into the input of said audio frequency amplifier, rectifier means for rectifying the output from said carrier wave amplifier, a first voltage divider network coupled to said rectifier means for developing an automatic-gain-control bias voltage, a second voltage divider network coupled to said rectifier means for developing a silencing bias voltage, and means for applying said silencing bias voltage to said gating means to control the passage therethrough of audio frequency signals.

2. The combination according to claim 1 wherein said voltage divider networks comprise resistive networks.

3. The combination according to claim 1, wherein said second voltage divider network includes means for producing a silencing biasing voltage approximately six times the gain-control biasing voltage.

4. A combination automatic-gain-control circuit and silencer circuit for developing suitable biasing voltages in response to the level of an input wave, comprising an amplifier tube having cathode, grid and anode electrodes, a resonant circuit coupled to the anode circuit of said tube and tuned to the frequency of said wave, said means for deriving a gain control biasing voltage comprising a voltage divider network coupled between a reference voltage and said resonant circuit, a ground connection, a biasing lead coupled to a given point on said voltage divider network and filtering means coupled between said biasing lead and said ground connection for bypassing the alternating current components of the wave to said ground connection and passing a direct-current biasing potential proportional to the average value of said wave, and said means for deriving a silencing biasing voltage comprises a voltage dividing network coupled to the output of said resonant circuit and filtering means coupled between said last-mentioned voltage dividing network and said ground connection for bypassing the alternating current components of the wave to said ground connection and passing a direct current biasing potential proportional to the average value of said wave.

5. The combination according to claim 4, wherein said reference voltage is negative with respect to said ground connection, and means coupled to said resonant circuit for rectifying the negative output from said thermionic tube and applying said negative output to said voltage divider, whereby the biasing potential comprises said negative output minus the voltage drop across said voltage divider, and said biasing potential corresponds to the reference voltage during the absence of the input wave.

6. The combination according to claim 4, wherein said last mentioned voltage dividing network is a resistive network producing a silencing biasing potential approximately six times the value of the gain control biasing potential.

7. A combination automatic gain control circuit and silencer circuit for developing suitable biasing voltages in response to the amplitude of a carrier wave, comprising an input circuit tuned to the frequency of a carrier wave, a thermionic amplifier tube coupled to the output of said input circuit, means rendering said amplifier normally inoperative, said amplifier being rendered operative in response to a given amplitude of the carrier wave, rectifier means coupled to the output of said amplifier for rectifying the negative half of said carrier wave, a gain control biasing circuit comprising a voltage divider resistive network having one terminal coupled to the output of said rectifier means and another terminal coupled to a negative source of reference potential, a biasing lead coupled to said voltage divider circuit, filtering means coupled to said biasing lead to produce direct-current biasing potential proportional to the average value of the carrier wave, and a silencer biasing circuit comprising a voltage divider resistive network having one terminal connected to said output of the rectifying means and another terminal coupled to a filtering circuit for producing a direct-current biasing potential proportional to the average value of the carrier wave.

8. A combination automatic gain control circuit and silencer circuit for developing suitable biasing voltages in response to the amplitude of a carrier wave, comprising an input circuit tuned to the frequency of a carrier wave, a thermionic amplifier tube coupled to the output of said input circuit, means rendering said amplifier normally inoperative, said amplifier being rendered operative in response to a given amplitude of the carrier wave, rectifier means coupled to the output of said amplifier for rectifying the negative half of said modulated carrier wave, a gain control biasing circuit comprising a voltage divider having one terminal coupled to the output of said rectifier means and another terminal coupled to a negative source of reference potential, a biasing lead coupled to said voltage divider circuit, filtering means coupled to said biasing lead to produce a direct-current biasing potential proportional to the average value of the carrier wave, a silencer biasing circuit comprising a voltage divider network having one terminal connected to said output of the rectifying means and another terminal coupled to a filtering circuit for producing a direct-current biasing potential proportional to the average value of the carrier wave, a silencing gating circuit comprising a diode having its cathode coupled to the voltage divider network of said silencer biasing network, means applying a positive source of biasing potential to the anode and cathode of said diode, whereby during the absence of an input wave the diode is rendered inoperative, and during the presence of a wave a negative voltage is developed by said silencer biasing circuit thereby reducing the potential on the cathode of said diode and rendering it conducting.

9. A combination automatic gain control circuit and silencer circuit for developing suitable biasing voltages in response to the amplitude of a carrier wave, comprising an input circuit tuned to the frequency of a modulated carrier wave, a modulation frequency filtering circuit coupled to one terminal of said input circuit and adapted to pass only the modulation frequencies, a first detector coupled to another terminal of said input circuit and adapted to rectify the positive half of said modulated carrier wave, an amplifier tube coupled to the output of said input circuit, means rendering said amplifier normally inoperative, said amplifier being rendered operative in response to a given amplitude of said carrier wave, a second detector coupled to the output of said amplifier tube and adapted to rectify the negative half of said modulated carrier wave, a gain control biasing circuit comprising a voltage divider having one terminal coupled to the output of said second detector and another terminal coupled to a negative source of reference potential, a biasing lead coupled to said voltage divider circuit, filtering means coupled to said biasing lead to produce a direct-current biasing potential proportional to the average value of the carrier wave, a silencer biasing circuit comprising a voltage divider network having one terminal connected to said output of the second detector and another terminal coupled to a filtering circuit for producing a direct-current biasing potential proportional to the average value of the carrier wave, a silencing gating circuit comprising a diode having its cathode coupled to the voltage divider network of said silencer biasing network and to the output of said modulation frequency filtering circuit, means applying a positive source of biasing potential to the anode and cathode of said diode, whereby during the absence of an input wave the diode is rendered inoperative, and during the presence of a wave a negative voltage is developed by said silencer biasing circuit thereby reducing the potential on the cathode of said diode and rendering it conducting, whereby the modulation frequencies are passed therethrough.

10. A combination automatic gain control circuit and silencer circuit for developing suitable biasing voltages in response to the amplitude of a carrier wave, comprising an input circuit tuned to the frequency of a modulated carrier wave, a modulation frequency filtering circuit coupled to one terminal of said input circuit and adapted to pass only the modulation frequencies, a first detector coupled to another terminal of said input circuit and adapted to rectify the positive half of said modulated carrier wave, an amplifier tube having cathode, grid and anode electrodes, the grid electrode being coupled to the output of said input circuit, a biasing potential coupled to said grid rendering said amplifier normally inoperative, said amplifier being rendered operative in response to a given amplitude of the carrier wave, a resonant circuit coupled in the anode circuit of said amplifier tube and tuned to the modulated carrier frequency, a second detector coupled to the output of said resonant circuit and adapted to rectify the negative half of said modulated carrier wave, a gain control biasing circuit comprising a voltage divider having one terminal coupled to the output of said second detector and another terminal coupled to a negative source of reference potential, a biasing lead coupled to said voltage divider circuit, filtering means coupled from said biasing lead to ground to by-pass the modulation frequencies to ground and pass a direct-current biasing potential proportional to the average value of the carrier wave, a silencer biasing circuit comprising a voltage divider network having one terminal connected to said output of the second detector and another terminal coupled over a filtering circuit to ground, the filtering circuit adapted to by-pass the modulation frequencies to ground and pass a direct-current biasing potential proportional to the average value of the carrier wave, a gating circuit comprising a diode having its cathode coupled to the voltage divider network of said silencer biasing network and to the output of said modulation frequency filtering circuit, a modulating frequency amplifier coupled to the output of said diode, means applying a positive source of biasing potential to the anode and cathode of said diode, whereby during the absence of an input wave the diode is rendered inoperative, and during the presence of a wave a negative voltage is developed by said silencer biasing circuit thereby reducing the potential on the cathode of said diode and rendering it conducting, whereby the modulation frequencies are passed therethrough.

11. The circuit according to claim 10, wherein said gain control voltage divider comprises a pair of resistors serially connected between said second detector and said reference potential and said biasing lead being coupled to the junction point of said resistors.

12. The circuit according to claim 10, wherein said silencer voltage divider comprises a pair of resistors serially connected between said second detector and ground, and a third resistor coupled between the junction of said latter-mentioned pair of resistors and the cathode of said gating diode.

References Cited in the file of this patent

UNITED STATES PATENTS 2,070,354 Brand ---------------- Feb. 9, 1937
2,337,005 Selby ---------------- Dec. 14, 1943